United States Patent
Li

(10) Patent No.: US 12,136,928 B2
(45) Date of Patent: Nov. 5, 2024

(54) PULSE ELIMINATION CIRCUIT, VOLTAGE DETECTION CIRCUIT AND DETECTING METHOD

(71) Applicant: Chipone Technology (Beijing) Co., Ltd., Beijing (CN)

(72) Inventor: Jinbo Li, Beijing (CN)

(73) Assignee: CHIPONE TECHNOLOGY (BEIJING) CO., LTD., Beijing (CN)

( * ) Notice: Subject to any disclaimer, the term of this patent is extended or adjusted under 35 U.S.C. 154(b) by 0 days.

(21) Appl. No.: 17/918,099

(22) PCT Filed: Mar. 3, 2021

(86) PCT No.: PCT/CN2021/078953
§ 371 (c)(1),
(2) Date: Mar. 26, 2023

(87) PCT Pub. No.: WO2021/203875
PCT Pub. Date: Oct. 14, 2021

(65) Prior Publication Data
US 2023/0412177 A1   Dec. 21, 2023

(30) Foreign Application Priority Data
Apr. 8, 2020   (CN) .......................... 202010272031.8

(51) Int. Cl.
*H03L 7/197*   (2006.01)
*H03K 5/131*   (2014.01)
(Continued)

(52) U.S. Cl.
CPC ........... *H03L 7/1978* (2013.01); *H03K 5/131* (2013.01); *H03K 19/20* (2013.01); *H03L 7/1803* (2013.01)

(58) Field of Classification Search
CPC ..... H03L 7/1978; H03L 7/1803; H03K 5/131; H03K 19/20; H03K 5/01; H03K 5/1252;
(Continued)

(56) References Cited

U.S. PATENT DOCUMENTS 5,687,202 A * 11/1997 Eitrheim ............... H03L 7/0997
331/10
6,094,082 A * 7/2000 Gaudet .................. H03L 7/0812
327/276
(Continued)

FOREIGN PATENT DOCUMENTS

| CN | 101267194 | 9/2008 |
| CN | 103222193 | 7/2013 |

(Continued)

*Primary Examiner* — John W Poos
(74) *Attorney, Agent, or Firm* — Treasure IP group, LLC

(57) ABSTRACT

Disclosed is a pulse elimination circuit, a voltage detection circuit and a detection method, referring to a field of electronic circuit technology. The pulse elimination circuit comprises: a clock generation circuit configured to receive a logic signal and a first input signal and generate a clock signal according to the logic signal and the first input signal; a counter coupled with the clock generation circuit and configured to receive the clock signal and count a number of cycles of the clock signal to generate a second input signal; a signal output circuit coupled to the counter and configured to supply a first input signal to the clock generation circuit and generate a pulse elimination signal based on the second input signal. Therefore, in a process of voltage detection, this circuit can eliminate a false trigger caused by short pulse and improve voltage detection accuracy.

13 Claims, 8 Drawing Sheets

(51) Int. Cl.
*H03K 19/20* (2006.01)
*H03L 7/18* (2006.01)

(58) Field of Classification Search
CPC ........ H03K 5/135; H03K 3/0315; H03K 5/08; H03K 5/26; H03K 17/16; H03K 2005/00078; H03K 3/0231; H03K 17/223; H03K 19/018521; H03K 19/00361; H03K 17/22; H03K 3/037; H03K 5/13; H03K 19/017509; H03K 5/153

See application file for complete search history.

(56) References Cited

U.S. PATENT DOCUMENTS

| | | | |
|---|---|---|---|
| 10,003,328 B1* | 6/2018 | Yin | .......................... H03K 7/08 |
| 2010/0090730 A1 | 4/2010 | Wu | |
| 2014/0063856 A1 | 3/2014 | Huang et al. | |
| 2015/0317496 A1 | 11/2015 | Olmos et al. | |
| 2017/0237441 A1* | 8/2017 | Peltonen | ................ H03K 19/20 |
| | | | 331/158 |
| 2019/0379368 A1* | 12/2019 | Lin | ........................ H03K 5/135 |

FOREIGN PATENT DOCUMENTS

| CN | 110690822 | 1/2020 |
|---|---|---|
| CN | 111404517 | 7/2020 |

\* cited by examiner

PULSE ELIMINATION CIRCUIT, VOLTAGE DETECTION CIRCUIT AND DETECTING METHOD

CROSS-REFERENCE TO RELATED APPLICATION

The present disclosure is a Section 371 National Stage application of International Application No. PCT/CN2021/078953, which is filed on 3 Mar. 2021 and published as WO/2021/203875 on 14 Oct. 2021, and claims priority to a Chinese Patent Application No. 202010272031.8, entitled "Pulse Elimination Circuit, Voltage Detection Circuit, and Detecting Method", filed on Apr. 8, 2020, the entire contents of which is incorporated herein by reference in its entireties.

FIELD OF THE DISCLOSURE

The present disclosure relates to a field of voltage detection technology, in particular to a pulse elimination circuit, a voltage detection circuit, a detecting method and an electronic device.

DESCRIPTION OF THE RELATED ART

Driver chips corresponding to active-matrix organic light-emitting diodes (AMOLEDs) are in increasing demand, and a driver chip is required to perform voltage detection in real time by used of a voltage detection module, in order to prevent voltage shortage or abnormal power failure.

At present, the voltage detection module is mostly realized by a hysteresis comparator, which is configured to output a high-level voltage when a detected voltage is lower than a low-level (voltage limiting) threshold voltage, and output a low-level voltage when the detected voltage is higher than a high-level (voltage limiting) threshold voltage, so as to detect voltage insufficiency or abnormal power failure. However, if there is a short pulse and there is no actual power failure or voltage insufficiency, a detection error may be caused by the short pulse.

SUMMARY

An objective of embodiments of the present disclosure is to provide a pulse elimination circuit capable of eliminating an interference caused by a short-duration pulse, so as to, for example, improve voltage detection accuracy.

According to an embodiment of the present disclosure, a short pulse elimination circuit is provided, and comprises:
- a clock generation circuit, configured to receive a logic signal and a first input signal and generate a clock signal based on the logic signal and the first input signal;
- a counter, coupled to the clock generation circuit and configured to receive the clock signal and count a number of cycles of the clock signal to generate a second input signal;
- a signal output circuit, coupled to the counter, and configured to supply the first input signal to the clock generation circuit and generate a pulse elimination signal based on the second input signal.

In some embodiments, the clock generation circuit comprises:
- a first AND gate circuit, wherein one input terminal of the first AND gate circuit is configured to receive the logic signal, and another input terminal of the first AND gate circuit is configured to receive the first input signal;
- an oscillator, which has an enable terminal coupled with an output terminal of the first AND gate circuit;
- a second AND gate circuit, which has one input terminal configured to receive the first input signal, another input terminal coupled to a clock pulse output terminal of the oscillator, and an output terminal coupled to the counter and configured to output the clock signal to the counter.

In some embodiments, the signal output circuit comprises:
- a multi-input AND gate circuit, having a plurality of inputs terminals configured to receive the second input signal;
- a first flip-flop, having a signal input terminal coupled with an output terminal of the multi-input AND gate circuit;
- a second flip-flop, having a signal input terminal coupled with a signal output terminal of the first flip-flop;
- a NAND gate circuit, having one input terminal coupled with the signal output terminal of the first flip-flop, another input terminal coupled with a signal output terminal of the second flip-flop, and an output terminal configured to output the first input signal to the clock generation circuit; and
- a first inverter, having an input terminal coupled with the output terminal of the NAND gate circuit, and an output terminal configured to output the pulse elimination signal.

In some embodiments, a clock pulse input terminal of the first flip-flop is coupled to a clock signal output terminal of the clock generation circuit.

In some embodiments, the signal output circuit further comprises: a second inverter, having one terminal coupled with the clock signal output terminal of the clock generation circuit, and another terminal coupled with a clock pulse input terminal of the second flip-flop.

In some embodiments, an enable terminal of the first flip-flop and an enable terminal of the second flip-flop are configured to receive the logic signal.

In some embodiments, an enable terminal of the counter is configured to receive the logic signal.

In some embodiments, in the counter, the second input signal comprises a plurality of output signals of the counter.

In some embodiments, in the signal output circuit, generating the pulse elimination signal based on the second input signal comprises: if it is determined that the plurality of output signals of the counter are all at high voltage level, generating the pulse elimination signal.

According to a second aspect of the present disclosure, a voltage detection circuit is provided and comprises:
- the pulse elimination circuit according to any embodiment of the present disclosure;
- a hysteresis comparator, which has an output terminal coupled to the clock generation circuit and is configured to provide the logic signal to the clock generation circuit;
- wherein a non-inverting input terminal of the hysteresis comparator is configured to receive a reference voltage and an inverting input terminal of the hysteresis comparator is configured to receive a second voltage signal;
- wherein the hysteresis comparator is configured to compare the second voltage signal with the reference voltage and output the corresponding logic signal based on a comparison result.

In some embodiments, the voltage detection circuit further comprises:

a voltage regulator circuit, having an input terminal configured to input a first voltage signal, and an output terminal coupled to the inverting input terminal of the hysteresis comparator;

wherein the voltage regulator circuit is configured to boost or reduce a voltage of the first voltage signal to obtain the second voltage signal.

In some embodiments, by the voltage regulator circuit, boosting or reducing the voltage of the first voltage signal comprises: boosting, through the voltage regulator circuit, the voltage of the first voltage signal with a fixed proportional value; or reducing, through a voltage dividing resistor, the voltage of the first voltage signal with a fixed proportional value.

According to a third aspect of the present disclosure, a voltage detecting method is provided, and comprises:

receiving, by a voltage regulator circuit, a first voltage signal to be detected, and obtaining a second voltage signal by boosting or reducing a voltage of the first voltage signal;

comparing the second voltage signal with a reference voltage by a hysteresis comparator to obtain a logic signal;

eliminating, by a pulse elimination circuit, a sudden change of pulse which has a duration less than a threshold value indicated by the logic signal to obtain a pulse elimination signal.

According to a fourth aspect of the present disclosure, an electronic device is provided, and comprises the voltage detection circuit according to any embodiment of the present disclosure.

In some embodiments, the electronic device comprises an AMOLED driver, an LCD driver, a power management device, or a voltage detection device.

In some embodiments, the electronic device is an intelligent mobile device, a display device, a power supply device, a DC detection device or an alarm device.

According to embodiments of the present disclosure, the clock signal is generated by the clock generation circuit according to the logic signal and the first input signal, and the counter is configured to count the number of cycles of the clock signal and output the corresponding second input signal. The signal output circuit is configured to output the pulse elimination signal according to the second input signal, so that when the number of cycles of the logic signal reaches a certain number, the pulse elimination signal can be output at high voltage level, thereby eliminating a short pulse contained in the logic signal, eliminating a false trigger which may be caused by the short pulse, and improving signal stability and voltage detection accuracy.

BRIEF DESCRIPTION OF THE DRAWINGS

In order to explain technical solutions according to the embodiments of the present disclosure more clearly, drawings corresponding to the embodiments of the present disclosure are briefly introduced below, wherein.

DETAILED DESCRIPTION OF EMBODIMENTS OF THE DISCLOSURE

Figure 1:
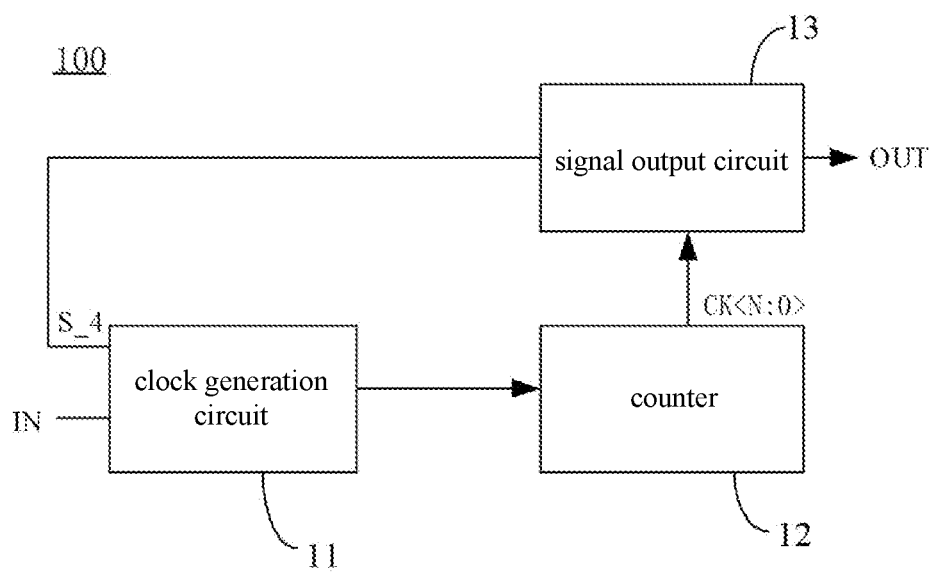
FIG. 1 is a schematic diagram of a pulse elimination circuit according to an embodiment of the present disclosure.

Technical solutions according to the embodiments of the present disclosure will be described below with reference to the drawings corresponding to the embodiments of the present disclosure.

Similar numerals and letters denote similar items in the drawings, and therefore, once an item is defined in one drawing, it does not need to be further defined and explained in a subsequent drawing. Meanwhile, in the description of the present disclosure, terms "first", "second" and the like are used only to distinguish descriptions and should not be understood to indicate or imply relative importance.

FIG. 1 is a schematic diagram of a pulse elimination circuit according to an embodiment of the present disclosure. As shown in FIG. 1, the pulse elimination circuit 100 may comprise a clock generation circuit 11, a counter 12 and a signal output circuit 13. The counter 12 may be coupled to the signal output circuit 13 and the clock generation circuit 11, respectively.

The clock generation circuit 11 may be configured to receive a logic signal IN and a first input signal S_4, and may generate a clock signal based on the logic signal IN and the first input signal S_4.

The counter 12 may be coupled with the clock generation circuit 11, and may be configured to receive the clock signal and may count the number of cycles of the clock signal to generate a second input signal CK<N:0>, where N+1 represents the number of bits of the output signal of the counter 12. Assuming that the signal output by the counter 12 is 4 bits, thus N is 3.

Alternatively, the second input signal may comprise a plurality of output signals of the counter 12, for example, if the counter 12 is a 4-bit binary counter, the second input signal may comprise four output signals, i.e., the four output signals of the counter 12 may serve as the second input signal.

The signal output circuit 13 may be coupled to the counter 12, the signal output circuit 13 may be configured to supply the first input signal S_4 to the clock generation circuit 11, and may generate a pulse elimination signal OUT according to the second input signal CK<N:0>.

Optionally, a step of generating, in the signal output circuit, the pulse elimination signal according to the second input signal, comprises: generating the pulse elimination signal when it is determined that the plurality of output signals provided by the counter are all at high voltage level. For example, the counter 12 may be a 4-bit binary counter, and the pulse elimination signal OUT may be generated according to the second input signal CK<3:0> when it is determined that four signals comprised by the second input signal are all at high voltage level, in other words, the pulse elimination signal OUT may be at high voltage level when it is determined that all of the four signals comprised by the second input signal are at high voltage level, and the pulse elimination signal OUT may be at low voltage level during the rest of the time. Specifically, the above-mentioned functions can be realized by use of, for example, an AND gate circuit with 4 input terminals.

It should be understood that, in the embodiment of the present disclosure, it is described that time required for triggering a generation of the pulse elimination signal can be set by the counter, thereby achieving a purpose of eliminating a short pulse with short duration in the circuit. However, the embodiment of the present disclosure does not limit how to set a counting period of the counter and how to connect the counter with its subsequent logic circuit. As an example, the counter can be implemented by a 3-bit binary counter or a 4-bit binary counter, which can be selected depending on a length of an interference short pulse that actually needs to be eliminated; additionally, the counter and its subsequent logic circuit, such as an AND gate circuit, can be modified arbitrarily according to counting requirements. For example, an inverter may be added between a first output terminal of the 4-bit binary counter and the 4-input AND gate circuit, so that the pulse elimination signal can be generated when counting to 0111, that is, the 4-bit binary counter is transformed into a 3-bit binary counter. The above examples do not limit the protection scope of the present disclosure.

Alternatively, when both the logic signal IN and the first input signal S_4 are at high voltage level, the clock generation circuit 11 is configured to output the clock signal, which may have a fixed cycle.

The logic signal IN may also be input to an enable terminal of the counter 12, so that when the logic signal IN is at high voltage value, the counter 12 is turned on. The counter 12 may be configured to receive the clock signal output from the clock generation circuit 11 and count the number of cycles of the received clock signal.

Figure 2:
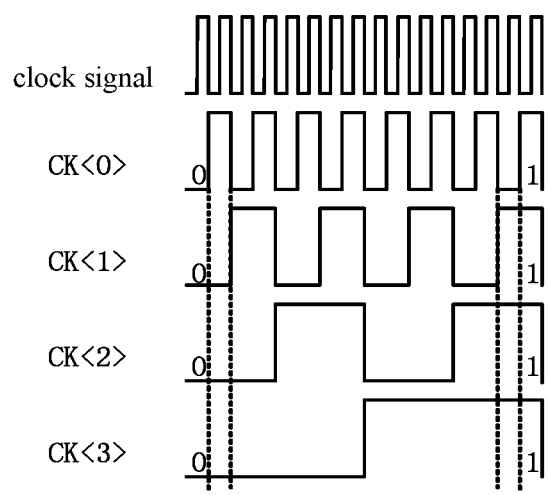
FIG. 2 is a schematic diagram of waveforms of a clock signal and a second input signal.

Taking a 4-bit counter 12 as an example, FIG. 2 shows schematic waveform diagrams of the clock signal and the second input signal CK<N:0>. In this embodiment, the clock signal may be an input signal of the counter 12. For example, if the counter 12 is a 4-bit binary counter, CK<3>, CK<2>, CK<1>, and CK<0> may be a first signal, a second signal, a third signal, and a fourth signal comprised by the output signal (i.e., the second input signal) of the counter 12, respectively. Before receiving a complete clock cycle of the clock signal, the counter 12 outputs 0000, corresponding to a decimal value 0; when one complete clock cycle of the clock signal is received, the counter 12 outputs 0001, corresponding to a decimal value 1; when two complete clock cycles of the clock signal are received, the counter 12 outputs 0002, corresponding to a decimal value 2, and so on. When 15 clock cycles of the clock signal are received by the counter 12, the counter 12 outputs 1111, corresponding to a decimal value 15.

The logic signal IN may also be input to an enable terminal of the signal output circuit 13, so that the signal output circuit 13 is turned on when the logic signal IN is at high voltage level. The signal output circuit 13 may receive the second input signal CK<N:0> which is output by the counter 12. Alternatively, when the signal output circuit 13 receives 1111, that is, when the counter 12 has received 15 clock cycles of the clock signal, the pulse elimination signal OUT which is output by the signal output circuit 13 may be at high voltage level; when less than 15 clock cycles of the clock signal is received by the counter 12, the pulse elimination signal OUT output by the signal output circuit 13 may be at low voltage level.

When the logic signal IN has a duration less than 15 clock cycles, the pulse elimination signal OUT output by the signal output circuit 13 may be at low voltage level; and when the logic signal IN has a duration longer than 15 clock cycles, the pulse elimination signal OUT at high voltage level can be continuously output by the signal output circuit 13, so that when the logic signal IN is a short pulse with a short duration, since a pulse period of the short pulse does not reach 15 clock cycles, the signal output circuit 13 does not output the pulse elimination signal OUT at high voltage level, thereby eliminating interference caused by the short pulse. Optionally, a pulse having a pulse period less than 10 microseconds can be considered as a short pulse.

Before the second input signal CK<N:0> received by the signal output circuit 13 reaches 1111, that is, before the logic signal IN represents that the cycle number is less than 15 cycles, the first input signal S_4 transmitted by the signal output circuit 13 to the clock generation circuit 11 may be at high voltage level, thus prompting the clock generation circuit 11 to continuously output the clock signal until the signal output circuit 13 receives the second input signal CK<N:0>=1111, and the first input signal S_4 which is output by the signal output circuit 13 is at low voltage level, thereby the clock generation circuit 11 stops operating, so that the power consumption of the clock generation circuit 11 can be reduced. The counter 12 continuously outputs 1111, so that the signal output circuit 13 continuously outputs a high-level voltage, until the logic signal IN at the enable terminal is at low voltage level, both the signal output circuit 13 and the counter 12 stop operating.

The number of trigger cycles, in which the signal output circuit 13 outputs a high-level voltage, may be set according to actual needs. Alternatively, when 0111 is received (i.e., when the counter 12 has received 7 cycles of the clock signal), the signal output circuit 13 may be output at high voltage level. Thus, even if the logic signal IN has a short pulse whose duration is less than 7 cycles, the signal output circuit 13 does not output a high-level voltage, so that the interference caused by the short pulse can be eliminated.

According to the technical proposal provided by the above embodiment, the clock signal is generated by the clock generation circuit 11 according to the logic signal IN and the first input signal S_4, and the counter 12 is configured to count the number of cycles of the clock signal and output the corresponding second input signal CK<N:0>. The signal output circuit 13 may be configured to output the pulse elimination signal OUT according to the second input signal CK<N:0>, so that when the number of cycles continuously provided in the logic signal IN reaches a certain number, the pulse elimination signal OUT can output a high-level voltage, thereby eliminating a short pulse contained in the logic signal, further eliminating false triggering caused by the short pulse, and improving signal stability and accuracy.

Figure 3:
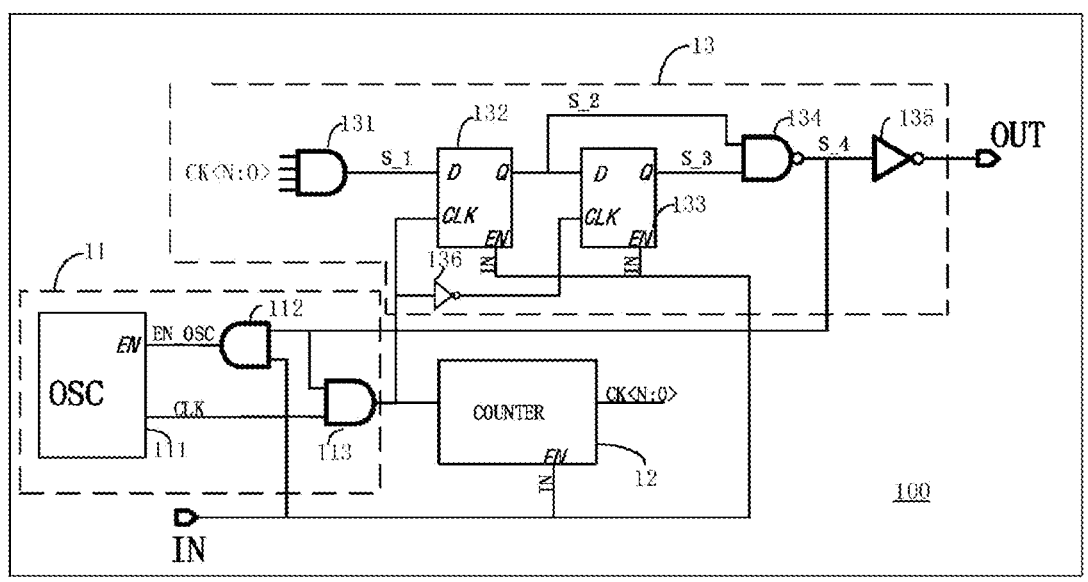
FIG. 3 is a schematic diagram of a pulse elimination circuit according to another embodiment of the present disclosure.

As shown in FIG. 3, the clock generation circuit 11 may include a first AND gate circuit 112, an oscillator (OSC) 111 and a second AND gate circuit 113.

An input terminal of the first AND gate circuit 112 may be configured to receive the logic signal IN and another input terminal of the first AND gate circuit 112 may be configured to receive the first input signal S_4, such that the first AND gate circuit 112 is configured to output a high-level voltage when both the logic signal IN and the first input signal S_4 are at high voltage level. When the logic signal IN and/or the first input signal S_4 is low, the first AND gate circuit 112 is configured to output a low-level voltage. The AND gate circuit herein is referred to as the first AND gate circuit 112 in order to distinguish it from other AND gate circuit hereinafter.

An enable terminal EN of the oscillator 111 may be coupled to the output terminal of the first AND gate circuit 112. When the first AND gate circuit 112 outputs a high-level voltage, the oscillator 111 operates; when the first AND gate circuit 112 outputs a low-level voltage, the oscillator 111 stops operating. The oscillator 111 may be considered as a frequency source which is configured to output a high-level voltage at a fixed frequency, that is, to output clock pulses.

An input terminal of the second AND gate circuit 113 may be configured to receive the first input signal S_4 and another input terminal of the second AND gate circuit 113 may be connected to a clock pulse output terminal of the oscillator 111; an output terminal of the second AND gate circuit 113 may be coupled to the counter 12 and may be configured to output the clock signal to the counter (COUNTER) 12. When the first input signal S_4 is at high voltage level, the clock signal which is output by the second AND gate circuit 113 is the same as the clock pulse which is output by the oscillator 111; when the first input signal S_4 is at low voltage level, the first AND gate circuit 112 is configured to output a low-level voltage, which may further cause the oscillator 111 to stop operating, so that the second AND gate circuit 113 also stops outputting the clock signal.

As shown in FIG. 3, the signal output circuit 13 may include a multi-input AND gate circuit 131, a first flip-flop 132, a second flip-flop 133, a NAND gate circuit 134 and a first inverter 135.

A plurality of input terminals of the multi-input AND gate circuit 131 may be configured to receive bits of the second input signal CK<N:0>, respectively. When the plurality of input terminals each receive a high-level voltage simultaneously, the multi-input AND gate circuit 131 may output a high-level voltage. For example, for a 4-input AND gate circuit, when the second input signal CK<N:0> is 1111 (i.e., four bits of the second input signal are all at high voltage level), the multi-input AND gate circuit 131 is configured to output a high-level voltage.

Alternatively, assuming that the logic signal IN maintains at high voltage level for more than 7 clock cycles and the final output signal (OUT) is at high voltage level, the second input signal CK<N:0> may be 0111 (CK<3>, CK<2>, CK<1>, CK<0>). The first signal CK<3> can be inverted by the inverter and then input to the multi-input AND gate circuit 131, so that when the second input signal CK<N:0> is 0111, the multi-input AND gate circuit 131 can output a high-level voltage.

A signal input terminal D of the first flip-flop 132 may be coupled to the output terminal of the multi-input AND gate circuit 131. The first flip-flop 132 may be a D flip-flop, and at a rising edge of the clock signal, a signal output terminal Q of the first flip-flop 132 is configured to provide an output signal changing with a signal received by the input terminal D, so that the first flip-flop 132 is configured to output a high-level voltage when the multi-input AND gate circuit 131 outputs a high-level voltage.

A signal input terminal D of the second flip-flop 133 may be coupled to the signal output terminal Q of the first flip-flop 132. While the first flip-flop 132 outputs a high-level voltage, the second flip-flop 133 may output a high-level voltage. The second flip-flop 133 may be the same as the first flip-flop 132.

An input terminal of the NAND gate circuit 134 may be coupled to the signal output terminal of the first flip-flop 132, and another input terminal of the NAND gate circuit 134 may be coupled to a signal output terminal Q of the second flip-flop 133; an output terminal of the NAND gate circuit 134 may be configured to output the first input signal S_4 to the clock generation circuit 11. When the first flip-flop 132 outputs a high-level voltage and the second flip-flop 133 outputs a high-level voltage, the NAND gate circuit 134 is configured to output a low-level voltage. Thus, when the number of cycles of the clock signal is less than a preset value (for example, 15 cycles), the multi-input AND gate circuit 131 is configured to output a low-level voltage, the first flip-flop 132 and the second flip-flop 133 each are configured to output a low-level voltage, and the NAND gate circuit 134 is configured to output a high-level voltage, i.e., the first input signal S_4 is at high voltage level, thereby prompting the clock generation circuit to continue to operate and output the clock signal.

An input terminal of the first inverter 135 may be coupled to the output terminal of the NAND gate circuit 134; an output terminal of the first inverter 135 may be configured to output the pulse elimination signal. When the NAND gate circuit outputs a low-level voltage, the first inverter 135 may output a high-level voltage, so that when the counter 12 counts that the number of cycles of the clock signal is larger than the preset value n, that is, when the logic signal IN at high voltage level lasting longer than nT (T denotes the cycle of the clock signal), the pulse elimination signal OUT which is output by the first inverter 135 is at high voltage level.

As shown in FIG. 3, a clock pulse input terminal CLK of the first flip-flop 132 may be coupled to a clock signal output terminal A of the clock generation circuit 11, so as to maintain timing synchronization of the whole circuit. Optionally, the signal output circuit 13 may further comprise: a second inverter 136, having one terminal coupled to the clock signal output terminal A of the clock generation circuit 11, and another terminal coupled to the clock pulse input terminal CLK of the second flip-flop 133.

The clock signal output by the clock generation circuit 11 is in reverse phase with the clock pulse received by the second flip-flop 133. The first flip-flop 132 is a rising-edge flip-flop, and the second inverter 136 and the second flip-flop 133 constitute a falling-edge flip-flop, so that the second flip-flop 133 is half a cycle later than the first flip-flop 132, thereby ensuring that the second flip-flop 133 can receive the signal output from the first flip-flop 132.

Optionally, the enable terminals EN of the first flip-flop 132 and the second flip-flop 133 are configured to receive the logic signal IN. Thus, the first flip-flop 132 and the second flip-flop 133 can be enabled when the logic signal IN is at high voltage level, and the first flip-flop 132 and the second flip-flop 133 can be disabled when the logic signal IN is at low voltage level.

Figure 4:
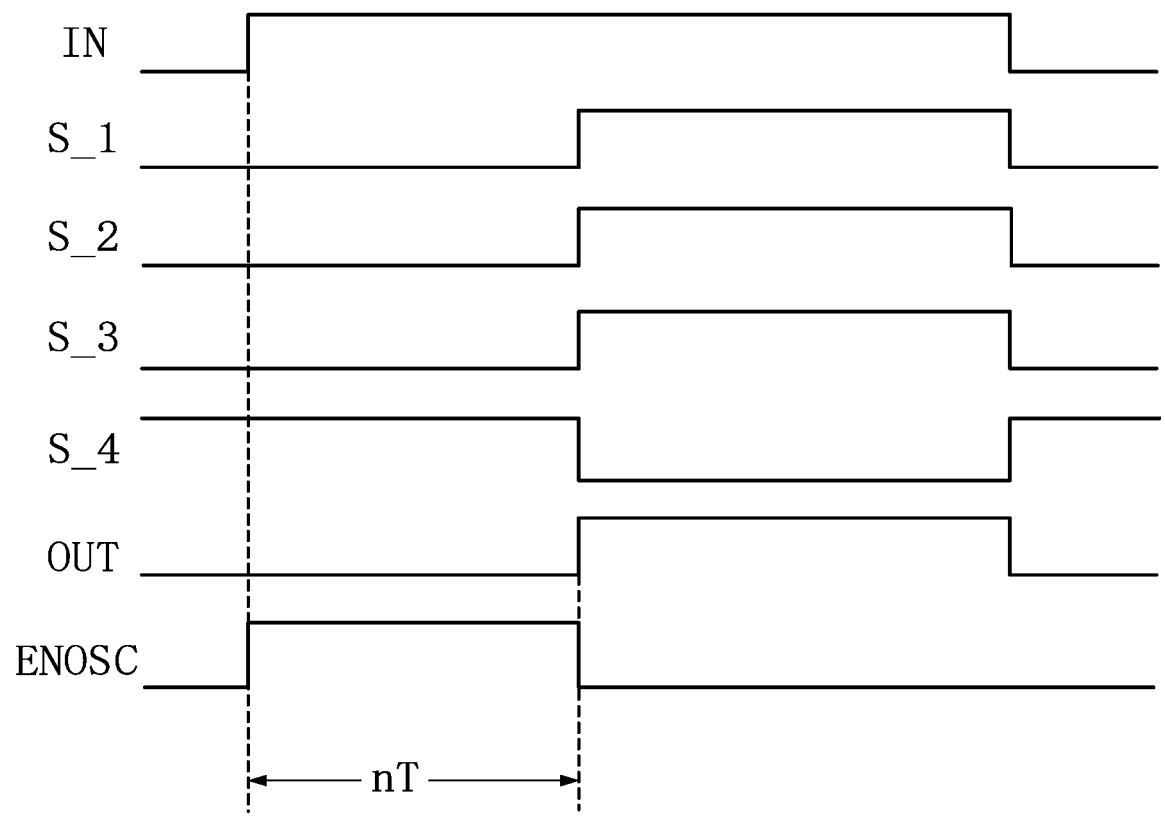
FIG. 4 is a schematic diagram of signal waveforms at different positions in the pulse elimination circuit as shown in FIG. 3.

FIG. 4 is a schematic diagram of signal waveforms at different positions in the pulse elimination circuit 100 as shown in FIG. 3. As shown in FIG. 4, IN represents the logic signal IN. In an initial state, the logic signal IN is set to be at low voltage level, and ENOSC is also 0. Then IN rises, the circuit starts counting with a rising edge of IN, at this time, the circuit starts to operate, ENOSC becomes high voltage level, the OSC (oscillator 111) starts to operate, the circuit starts to perform cycle counting, when IN at high voltage level lasting longer than nT (n is the preset number of clock cycles), that is, when the OSC output clock provide more than n cycles, the output of the multi-input AND gate circuit 131 becomes 1, and then the first flip-flop 132 and the second flip-flop 133 are triggered in turn, that is, S_2 and S_3 become 1 in turn; then the output S_4 of the NAND gate circuit 134 changes from 1 to 0; S_4 passes through the first inverter 135, so that a signal OUT is generated and changes from 0 to 1; S_4 passes through the first AND gate circuit 112, so that EN OSC is changed to 0 again. At this time, the signal OUT is output at high voltage level, ENOSC is at low voltage level, and the OSC is turned off. When a duration of IN maintaining at high voltage level is less than nT, the signal OUT will not be triggered. When the logic signal IN becomes a low-level voltage, the whole circuit stops operating.

Figure 5:
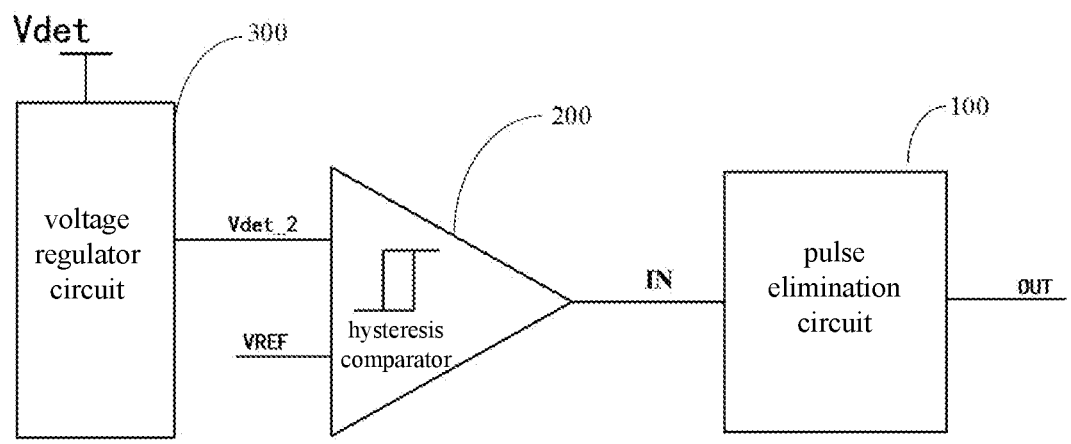
FIG. 5 is a schematic diagram of a voltage detection circuit according to an embodiment of the present disclosure.

FIG. 5 is a schematic diagram of a voltage detection circuit according to an embodiment of the present disclosure. As shown in FIG. 5, the voltage detection circuit includes a pulse elimination circuit 100 shown in FIG. 1 or 3, and may also include a hysteresis comparator 200.

An output terminal of the hysteresis comparator 200 is coupled to the clock generation circuit 11, and is configured to supply the logic signal IN to the clock generation circuit 11; a non-inverting input terminal of the hysteresis comparator 200 is configured to receive a reference voltage VREF and an inverting input terminal is configured to receive a second voltage signal Vdet_2. The hysteresis comparator 200 is configured to compare the second voltage signal Vdet_2 with the reference voltage to obtain the logic signal IN.

The logic signal IN which is output by the hysteresis comparator 200 may be supplied as an enable signal to the counter 12, the first flip-flop 132 and the second flip-flop 133.

Alternatively, the hysteresis comparator 200 may be a comparator having hysteresis loop transmission characteristics. The hysteresis comparator 200 can also be understood as a single-threshold comparator with positive feedback. A positive feedback network may be introduced on the basis of an inverting-input comparator with a single threshold voltage, so as to form an inverting-input hysteresis comparator 200 with double threshold voltages. The reference voltage VREF of the hysteresis comparator 200 is a reference voltage internally provided by the chip, and the voltage threshold of the logic signal IN can be adjusted by setting the VREF voltage.

The logic signal IN can be maintained at high voltage level until the second voltage signal Vdet_2 is incremented to being close to a high-level threshold voltage. When the second voltage signal Vdet_2 is further increased, the logic signal IN can be maintained at low voltage level. If the second voltage signal Vdet_2 decreases progressively, the logic signal IN remains at low voltage level as long as it is greater than a low-level threshold voltage, and the logic signal IN jumps to high voltage level only when the second voltage signal Vdet_2 is less than the low-level threshold value. Thus, even if the second voltage signal Vdet_2 has noise and ripple, the result of the logic signal IN is not affected, and the interference caused by the noise and ripple can be eliminated.

Optionally, as shown in FIG. 5, the voltage detection circuit also comprises a voltage regulator circuit 300.

Alternatively, an input terminal of the voltage regulator circuit 300 may be configured to receive a first voltage signal Vdet, an output terminal of the voltage regulator circuit 300 may be coupled to the inverting input terminal of the hysteresis comparator 200, and the voltage regulator circuit 300 may be configured to boost or reduce the voltage of the first voltage signal Vdet to output the second voltage signal Vdet_2.

Alternatively, the first voltage signal Vdet can be considered as a voltage signal to be detected. The voltage regulator circuit 300 may be configured to boost or reduce the voltage of the first voltage signal Vdet. Since a voltage magnitude of the voltage signal to be detected usually exceeds (to be higher or lower) an input voltage range of the subsequent hysteresis comparator 200, it is necessary to boost or reduce the voltage to be detected and adjust the voltage to be detected to a voltage within the input voltage range of the hysteresis comparator 200. If the voltage signal to be detected is relatively high, it can be reduced in a fixed proportion by resistor voltage division; if the voltage to be detected is relatively low, it can be boosted in a fixed proportion through a voltage regulator. Thus, the second voltage signal Vdet_2 proportional to the voltage signal to be detected is obtained. Assuming that a voltage regulation ratio is a fixed value K, then Vdet/Vdet2=K and Vdet/Δ Vdet2=K. Therefore, when the voltage Vdet to be detected changes, the second voltage signal Vdet_2 also changes in a fixed proportion.

Figure 6:
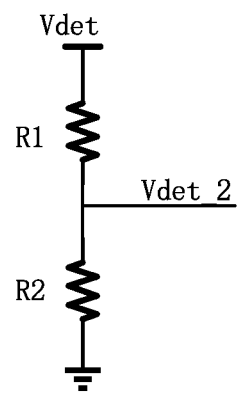
FIG. 6 is a schematic diagram of a voltage regulator circuit according to an embodiment of the present disclosure.

Optionally, in the voltage regulator circuit, step of boosting or reducing the first voltage signal comprises: boosting the first voltage signal with a fixed proportional value through a voltage regulator; or, reducing the first voltage signal by voltage dividing resistors with a fixed proportional value. FIG. 6 is a schematic diagram of a voltage regulator circuit 300 according to an embodiment of the present disclosure. As shown in FIG. 6, the first voltage signal Vdet is divided by a resistor R1 and a resistor R2 to generate the second voltage signal Vdet_2. The calculation formula is Vdet_2=(Vdet*R2)/(R1+R2). By reducing the voltage signal to be detected in advance by the voltage regulator circuit 300, voltage detection range can be expanded.

Figure 7:
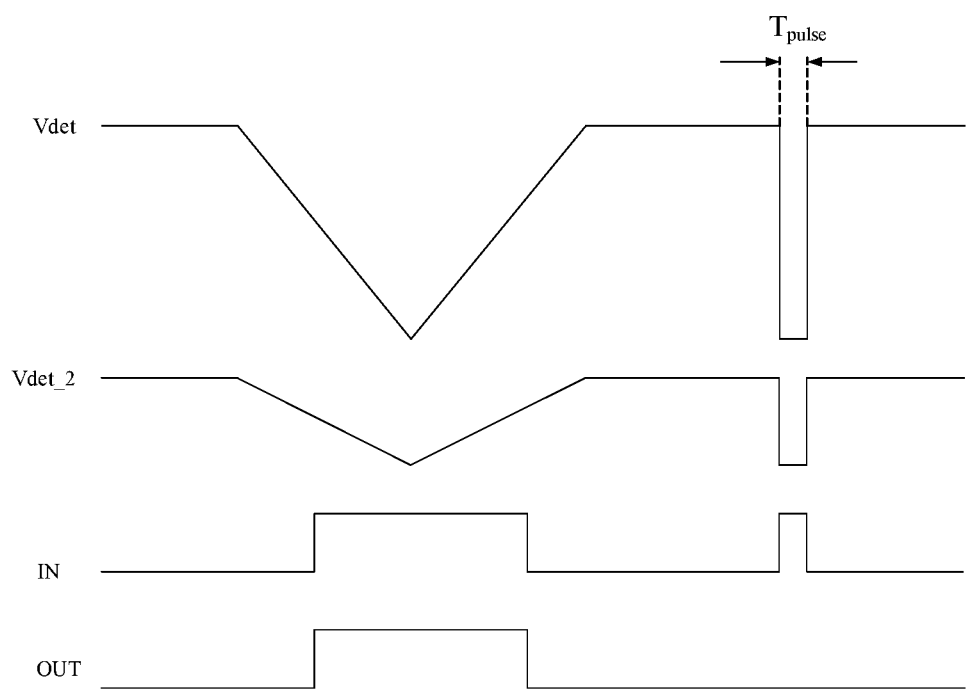
FIG. 7 is a schematic diagram of waveforms of a first voltage signal, a second voltage signal, a logic signal and a pulse elimination signal according to an embodiment of the present disclosure.

FIG. 7 is a schematic diagram of waveforms of the first voltage signal Vdet, the second voltage signal Vdet_2, the logic signal IN and the pulse elimination signal according to an embodiment of the present disclosure.

As shown in FIG. 7, Vdet represents the first voltage signal (i.e., a voltage to be detected), and the voltage regulator circuit 300 may adjust Vdet to the second voltage signal Vdet_2 which is suitable for being detected by the hysteresis comparator 200; the hysteresis comparator 200 may compare the second voltage signal Vdet_2 with the reference voltage and output the logic signal IN; after that, the pulse elimination circuit 100 can eliminate an erroneous short pulse Tpulse. Finally, a correct pulse elimination signal OUT is output.

Figure 8:
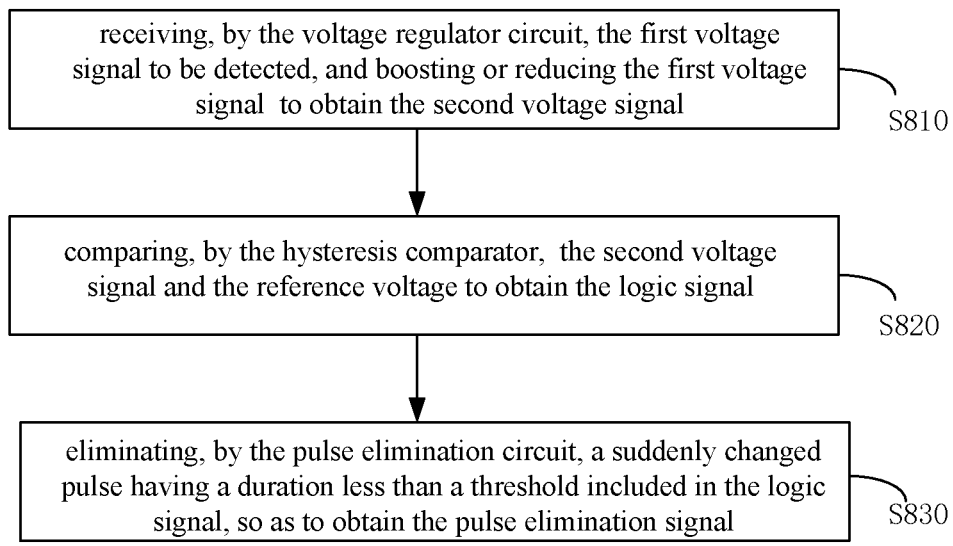
FIG. 8 is a flow diagram of the voltage detection method according to an embodiment of the present disclosure.

FIG. 8 is a flow diagram of a voltage detection method according to an embodiment of the present disclosure. The voltage detection method can be applied to the voltage detection circuit according to a corresponding embodiment as shown in FIG. 5. The voltage detection method may include the following steps S810-S830.

In step S810, the first voltage signal to be detected is received by the voltage regulator circuit 300, and the first voltage signal is boosted or reduced to obtain the second voltage signal;

In step S820, the second voltage signal and the reference voltage are compared by the hysteresis comparator 200 to obtain the logic signal;

In step S830, the pulse elimination circuit 100 is configured to eliminate a suddenly changed pulse whose duration is less than a threshold included in the logic signal, so as to obtain the pulse elimination signal.

The suddenly changed pulse refers to a short pulse having a duration less than the threshold. For example, if a pulse lasts for a duration less than 10 microseconds, that pulse can be considered as a short pulse.

The voltage regulator circuit 300, the hysteresis comparator 200 and the pulse elimination circuit 100 described above may be realized with reference to the above embodiments.

Figure 9:
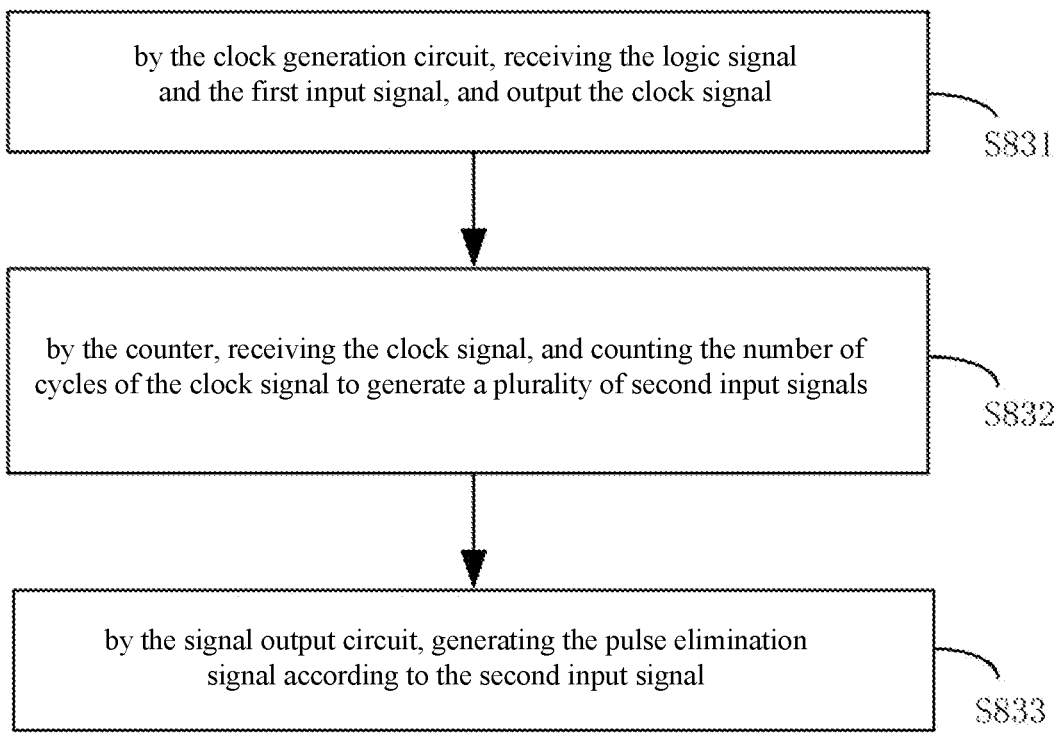
FIG. 9 is a detailed flow diagram of Step 830 in the corresponding embodiment as shown in FIG. 8.

Optionally, as shown in FIG. 9, the above-described step 830 for eliminating, by the pulse elimination circuit 100, a pulse abrupt change, which is contained by the logic signal and has a duration less than a threshold, and obtaining the pulse elimination signal may comprise following steps.

Step 831: by the clock generation circuit 11, the logic signal IN and the first input signal S_4 are received, and the clock signal is output. The first input signal S_4 may be output by the signal output circuit 13.

When the number of cycles of the clock signal is smaller than a preset number, the first input signal S_4 output by the signal output circuit 13 is at high voltage level, and the clock generation circuit 11 is configured to receive the logic signal IN at high voltage level and the first input signal S_4 at high voltage level, and output the clock signal.

Step 832: by the counter 12, the clock signal is received, and the number of cycles of the clock signal is counted to generate the second input signal CK<N:0>.

The counter 12 can count the number of cycles of the clock signal and output a multi-bit binary digital signal. For example, 0111 represents 7 cycles and 1111 represents 15 cycles. The second input signal CK<N:0> is the multi-bit binary digital signal generated by the counter 12. The second input signal CK<N:0> may be input to the signal output circuit 13.

Step 833: by the signal output circuit 13, the pulse elimination signal is generated according to the second input signal CK<N:0>.

The signal output circuit 13 is configured to receive the second input signal CK<N:0>, and generate the pulse elimination signal after processing the second input signal CK<N:0>. For example, when the second input signal CK<N:0> is 1111, the pulse elimination signal is output at high voltage level. When the second input signal CK<N:0> is less than 1111 (i.e., when the number of cycles of the clock signal is less than 15), the pulse elimination signal is output at low voltage level. Thereby, an interference caused by a short-duration pulse can be eliminated.

The voltage detection circuit and the voltage detecting method provided according to embodiments of the present disclosure can be applied to a driving chip of an AMOLED (Active Matrix Organic Light Emitting Diode) panel, can be used for detecting an external power supply voltage, and can also be used for detecting a voltage generated inside the chip. So that a voltage can be monitored in real time, a corresponding output will be triggered when the voltage is too low and/or suffers an abnormal power failure.

Embodiments of the present disclosure also provide an electronic device, which may comprise the voltage detection circuit as described in the above embodiments. The electronic device may comprise an AMOLED driving device, an LCD (Liquid Crystal Display) driving device, a power management device or a voltage detection device.

Alternatively, the electronic device may be an intelligent mobile device, which may be a smart phone provided with an AMOLED display screen or an LCD display screen, a smart wearable device, an intelligent robot, etc.

The electronic device may also be a display device, such as a television set, a computer or a display equipped with an AMOLED display screen or an LCD display screen.

The electronic device may also be a power supply device (e.g., a power supply box, a power box, a power distribution cabinet, a UPS uninterruptible power supply), a DC detection device or an alarm device. The voltage detection circuit provided according to embodiments of the present disclosure can be installed in the above-mentioned electronic device.

In several embodiments provided in the present disclosure, the disclosed device and method may also be implemented in other ways. The device embodiment described above is only illustrative, for example, the flowcharts and block diagrams in the drawings show the architectures, functions, and operations of possible implementations of the devices, methods, and computer program products according to various embodiments of the present disclosure. In this regard, each block in a flowchart or block diagram may represent a module, program segment, or part of code containing one or more executable instruction configured to perform a specified logical function. In some alternative implementations, the functions indicated in the blocks may also occur in a different order than those indicated in the drawings. For example, two successive blocks can actually be executed substantially in parallel, or they can sometimes be executed in reverse order, depending on an involved functionality. It should also be noted that each block in the block diagrams and/or flowcharts, and each combination of blocks in the block diagrams and/or flowcharts, may be implemented in a dedicated hardware-based system that performs a specified function or action, or may be implemented in a combination of dedicated hardware and computer instructions.

In addition, functional modules in an embodiment of the present disclosure may be integrated to form a stand-alone portion, or each functional module may exist separately, or two or more modules may be integrated to form a stand-alone portion.

A function may be stored in a computer-readable storage medium if implemented in a form of a software function module and sold or used as a stand-alone product. Based on this understanding, a technical proposal of the present disclosure, or a part that contributes to the prior art, or a part of the technical proposal, can be embodied in a form of a software product in essence, the computer software product is stored in a storage medium and includes instructions for controlling a computer device (which may be a personal computer, a server, a network device, etc.) to perform all or part of the steps of a method according to various embodiments of the present disclosure. The aforementioned storage medium includes a U disk, a removable hard disk, a Read-Only Memory (ROM), a Random Access Memory (RAM), a magnetic disk or an optical disk and other medium capable of storing program codes.

INDUSTRIAL PRACTICALITY

According to embodiments of the present disclosure, a pulse elimination circuit, a voltage detection circuit, a detecting method and an electronic device are provided. Since the pulse elimination circuit according to the embodiments of the present disclosure comprises a counter, a clock generation circuit and a signal output circuit, when the number of cycles of the logic signal reaches a certain number, a pulse elimination signal can be output at high voltage level, thereby eliminating a short pulse contained in the logic signal, eliminating a false trigger which may be caused by the short pulse, and improving signal stability and voltage detection accuracy.

What is claimed is:

1. A pulse elimination circuit comprising:
a clock generation circuit, configured to receive a logic signal and a first input signal and generate a clock signal based on the logic signal and the first input signal;
a counter, coupled with the clock generation circuit and configured to receive the clock signal and count a number of cycles of the clock signal to generate a second input signal;
a signal output circuit, coupled to the counter and configured to supply the first input signal to the clock generation circuit and to generate a pulse elimination signal based on the second input signal,
wherein the clock generation circuit comprises:
a first AND gate circuit, wherein one input terminal of the first AND gate circuit is configured to receive the logic signal, and another input terminal of the first AND gate circuit is configured to receive the first input signal;
an oscillator, which has an enable terminal coupled with an output terminal of the first AND gate circuit;
a second AND gate circuit, which has one input terminal configured to receive the first input signal, another input terminal coupled to a clock pulse output terminal of the oscillator, and an output terminal coupled to the counter and configured to output the clock signal to the counter.

2. The pulse elimination circuit according to claim 1, wherein the signal output circuit comprises:
a multi-input AND gate circuit, having a plurality of inputs terminals configured to receive the second input signal;
a first flip-flop, having a signal input terminal coupled with an output terminal of the multi-input AND gate circuit;
a second flip-flop, having a signal input terminal coupled with a signal output terminal of the first flip-flop;
a NAND gate circuit, having one input terminal coupled with the signal output terminal of the first flip-flop, another input terminal coupled with a signal output terminal of the second flip-flop, and an output terminal configured to output the first input signal to the clock generation circuit; and
a first inverter, having an input terminal coupled with the output terminal of the NAND gate circuit, and an output terminal configured to output the pulse elimination signal.

3. The pulse elimination circuit according to claim 2, wherein a clock pulse input terminal of the first flip-flop is coupled to a clock signal output terminal of the clock generation circuit.

4. The pulse elimination circuit according to claim 2, wherein the signal output circuit further comprises: a second inverter, having one terminal coupled with the clock signal output terminal of the clock generation circuit, and another terminal coupled with a clock pulse input terminal of the second flip-flop.

5. The pulse elimination circuit according to claim 2, wherein an enable terminal of the first flip-flop and an enable terminal of the second flip-flop are configured to receive the logic signal.

6. The pulse elimination circuit according to claim 1, wherein an enable terminal of the counter is configured to input the logic signal.

7. The pulse elimination circuit according to claim 1, wherein the second input signal of the counter comprises a plurality of output signals of the counter.

8. The pulse elimination circuit according to claim 7, wherein, in the signal output circuit, generating the pulse elimination signal based on the second input signal comprises:
if it is determined that the plurality of output signals of the counter are all at high voltage level, generating the pulse elimination signal.

9. A voltage detection circuit comprising:
the pulse elimination circuit according to claim 1;
a hysteresis comparator, which has an output terminal coupled to the clock generation circuit and is configured to provide the logic signal to the clock generation circuit;
wherein a non-inverting input terminal of the hysteresis comparator is configured to receive a reference voltage and an inverting input terminal of the hysteresis comparator is configured to receive a second voltage signal;
wherein the hysteresis comparator is configured to compare the second voltage signal with the reference voltage and output the corresponding logic signal based on a comparison result.

10. The voltage detection circuit according to claim 9, further comprising:
a voltage regulator circuit, having an input terminal configured to input a first voltage signal, and an output terminal coupled to the inverting input terminal of the hysteresis comparator;
wherein the voltage regulator circuit is configured to boost or reduce a voltage of the first voltage signal to obtain the second voltage signal.

11. The voltage detection circuit according to claim 10, wherein by the voltage regulator circuit, boosting or reducing the voltage of the first voltage signal comprises:
boosting, through the voltage regulator circuit, the voltage of the first voltage signal with a fixed proportional value; or
reducing, through a voltage dividing resistor, the voltage of the first voltage signal with a fixed proportional value.

12. A voltage detecting method, which is used in the voltage detection circuit according to claim 9, comprising:
receiving, by a voltage regulator circuit, a first voltage signal to be detected, and obtaining the second voltage signal by boosting or reducing a voltage of the first voltage signal;
comparing the second voltage signal with the reference voltage by the hysteresis comparator to obtain the logic signal;
eliminating, by the pulse elimination circuit, a sudden change of pulse which has a duration less than a threshold value indicated by the logic signal to obtain the pulse elimination signal.

13. An electronic device, comprising the voltage detection circuit according to claim 9,
wherein the electronic device comprises an AMOLED driver, an LCD driver, a power management device, or a voltage detection device, and/or
the electronic device is an intelligent mobile device, a display device, a power supply device, a DC detection device or an alarm device.

* * * * *